LOW LOSS THERMOELECTRIC HEAT EXCHANGER

Original Filed Jan. 15, 1963

INVENTORS
NEAL P. MILLIGAN &
JAMES P. BURGESS
BY
Barnes, Kisselle, Raisch & Choate
ATTORNEYS INVENTORS
NEAL P. MILLIGAN &
JAMES P. BURGESS
BY
Barnes, Kisselle, Raisch & Choate
ATTORNEYS United States Patent Office 3,216,205
Patented Nov. 9, 1965

3,216,205
LOW LOSS THERMOELECTRIC HEAT EXCHANGER

Neal P. Milligan and James P. Burgess, Columbus, Ohio, assignors to Tecumseh Products Company, Tecumseh, Mich., a corporation of Michigan Original application Ser. No. 251,618, Jan. 15, 1963. Divided and this application Dec. 31, 1964, Ser. No. 435,104
6 Claims. (Cl. 62—3)

This application is a division of our co-pending application Serial No. 251,618, filed January 15, 1963 and entitled "Low Loss Thermoelectric Heat Exchanger."

This invention relates to a thermoelectric heat exchanger and in particular to a cooling apparatus having an intermittently operated thermocouple.

Thermoelectric cooling systems generally comprise an insulated cold chamber, a thermocouple having its cold junction thermally coupled to the cold chamber, and a large efficient heat exchanger thermally coupled to the hot junction of the thermocouple. Such cooling systems are not efficiently energized intermittently by switching power on and off as in ordinary compressor type cooling systems because when the thermocouple is turned off after a desired cold temperature has been reached (operated intermittently), heat flows from the ambient to the cold chamber due to thermal conduction through the thermocouple.

The objects of this invention are to provide a temperature controlling thermoelectric system that minimizes the rate of heat flow between the ambient environment and the cooling chamber due to thermal conduction; that is especially adapted for use with the aforementioned thermoelectric cooling system to limit the rate of heat flow by thermal conduction from the ambient environment to the hot junction of the thermocouple when the thermocouple is not energized to a value very substantially less than the total rate of heat flow from the hot junction to the ambient environment when the thermocouple is energized; that provides efficient operation of an intermittently energized thermocouple; that requires little heat pumping to overcome only small losses while maintaining prescribed temperatures for long periods of time; and that will withstand power failures.

This invention is characterized by a connection between the temperature controlled chamber and the ambient environment in the form of a heat transfer path, a portion of which is insulated from the ambient and adapted to transfer heat substantially exclusive of thermal conduction.

Figure 1:
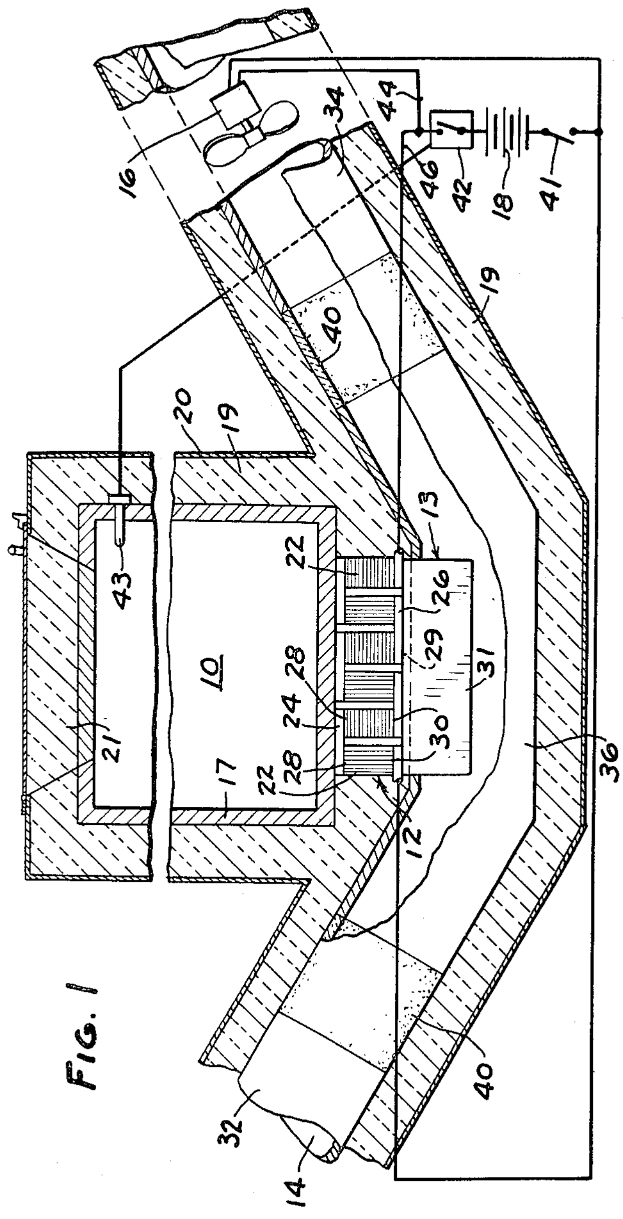
FIG. 1 is a schematic sectional view showing a thermoelectric cooling system having a fan for establishing convection heat transfer from a thermocouple to the ambient when the thermocouple is energized and a gravity entrapment device that isolates the thermocouple from the ambient when the thermocouple is not energized.

The thermoelectric cooling system shown in FIG. 1 generally comprises a cold chamber 10, a thermoelectric heat pump 12, a finned heat sink 13, a bent convection duct 14, an electrically operated fan 16 and a direct current power supply, illustrated as battery 18. Cold chamber 10 is bounded by walls 17, preferably made of high thermal conductivity material. Walls 17 and duct 14 have thermal insulation 19 encased in a protective housing 20. A sealable hinged door 21 is provided for access to cold chamber 10. Heat pump 12 comprises a plurality of thermocouples 22 connected in series across battery 18 by electrical conducting strips 24, 26. Thermocouples 22 are properly poled so that for a given polarity of battery 18, the junctions 28 adjacent conducting strips 24 are cold and the junctions 30 adjacent conducting strips 26 are hot. Heat sink 13 has a base plate 29, shown in broken lines, and a plurality of upstanding fins 31, the base plate 29 being thermally connected to but electrically insulated from conducting strips 26 by conventional means such as thin mica sheets. Conducting strips 24 are similarly insulated electrically from wall 17. Duct 14 has upwardly extending arms 32, 34 interconnected by a bight 36, bight 36 being below the upper ends of arms 32, 34 as viewed in FIG. 1. The upper ends of arms 32, 34 open to the ambient. Fins 31 of the heat sink 13 are positioned within bight 36. Duct 14 has a pair of annular segments 40 made of insulating material so that heat is not conducted between bight 36 and the upper ends of arms 32, 34 by the walls of duct 14. Fan 16 is positioned within arm 34 adjacent the open end thereof. Fan 16 and thermocouples 22 are connected in parallel across battery 18 through an on-off switch 41 and a temperature controlled switch 42. Switch 42 may be a conventional thermostatic switch providing a temperature lag between opening and closing in response to the temperature changes in cold chamber 10 sensed by element 43. Alternatively, switch 42 may be a bimetal thermostatic switch positioned within chamber 10. Any suitable circuit connection can be used to energize fan 16 and thermoelectric heat pump 12 so long as fan 16 is on when thermoelectric heat pump 12 is on and the fan is off when the pump is off.

When on-off switch 41 is closed, if the temperature in chamber 10 is above a prescribed cold temperature switch 42 will be closed automatically to energize fan 16 and heat pump 12. Heat is pumped from the cold chamber 10 into the bight 36 of duct 14 through electrical conducting strips 24, thermocouples 22, conducting strips 26 and heat sink 13. Heat is transferred from heat sink 13 to the ambient by convection currents established within duct 14 by fan 16. After the temperature of cold chamber 10 is reduced to a desired level, switch 42 opens automatically breaking the circuits for fan 16 and heat pump 12. With heat pump 12 off heat will flow from the mass of air in bight 36 through finned heat sink 13 and thermocouples 22 back into cold chamber 10 until the temperature of the air mass in bight 36 and the cold chamber 10 equalizes. The mass of air in bight 36, cooled below the ambient temperature by reverse heat flow, will be entrapped by gravity adjacent heat sink 13 to check reverse heat flow from the ambient through thermoelectric heat pump 12 to the cold chamber 10. When the temperature within cold chamber 10 rises to a predetermined level, switch 42 will close and the cooling process will repeat.

By properly choosing the relative mass of the components, temperature equalization for the system can be achieved with only a one or two degree temperature change in cold chamber 10. The thermal mass of cold chamber walls 17 should be relatively large while the thermal mass of thermoelectric heat pump 12, heat sink 13, and those portions of duct 14 below thermal insulating segment 40 and adjacent heat sink 13 should be held to a minimum. For example, the thermal mass of heat sink 13 may be minimized by using numerous thin fins 31.

Figure 2:
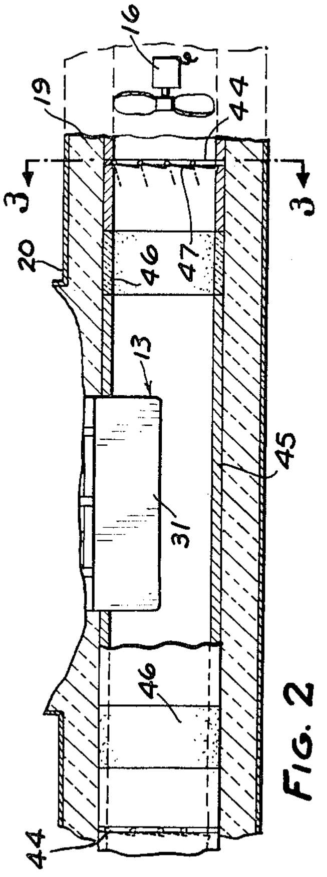
FIG. 2 is a fragmentary view illustrating a modification of the cooling system shown in FIG. 1 wherein louvered valves isolate the thermocouple and heat sink from the ambient when the thermocouple is not energized.
Figure 3:
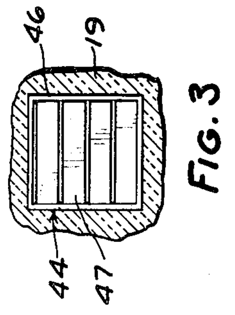
FIG. 3 is an end view of the louvered valve taken along lines 3—3 of FIG. 2.

The air entrapment device of FIG. 1 may be modified as shown in fragment in FIGS. 2 and 3. In the modification shown in FIG. 2 when fan 16 and heat pump 12 are off air is trapped adjacent heat sink 13 by a pair of valves 44 positioned in a straight rectangular cross section duct 45 outwardly of insulating segments 46. Valves 44 each have a plurality of pivoted louvered slats 47 that are opened automatically toward the left as viewed in FIG. 2 by convection within duct 45 when fan 16 is on and are closed automatically by gravity or suitable spring biasing (not shown) when fan 16 is off. Valves 44 may also be used with the bent convection duct 14 in FIG. 1.

Figure 4:
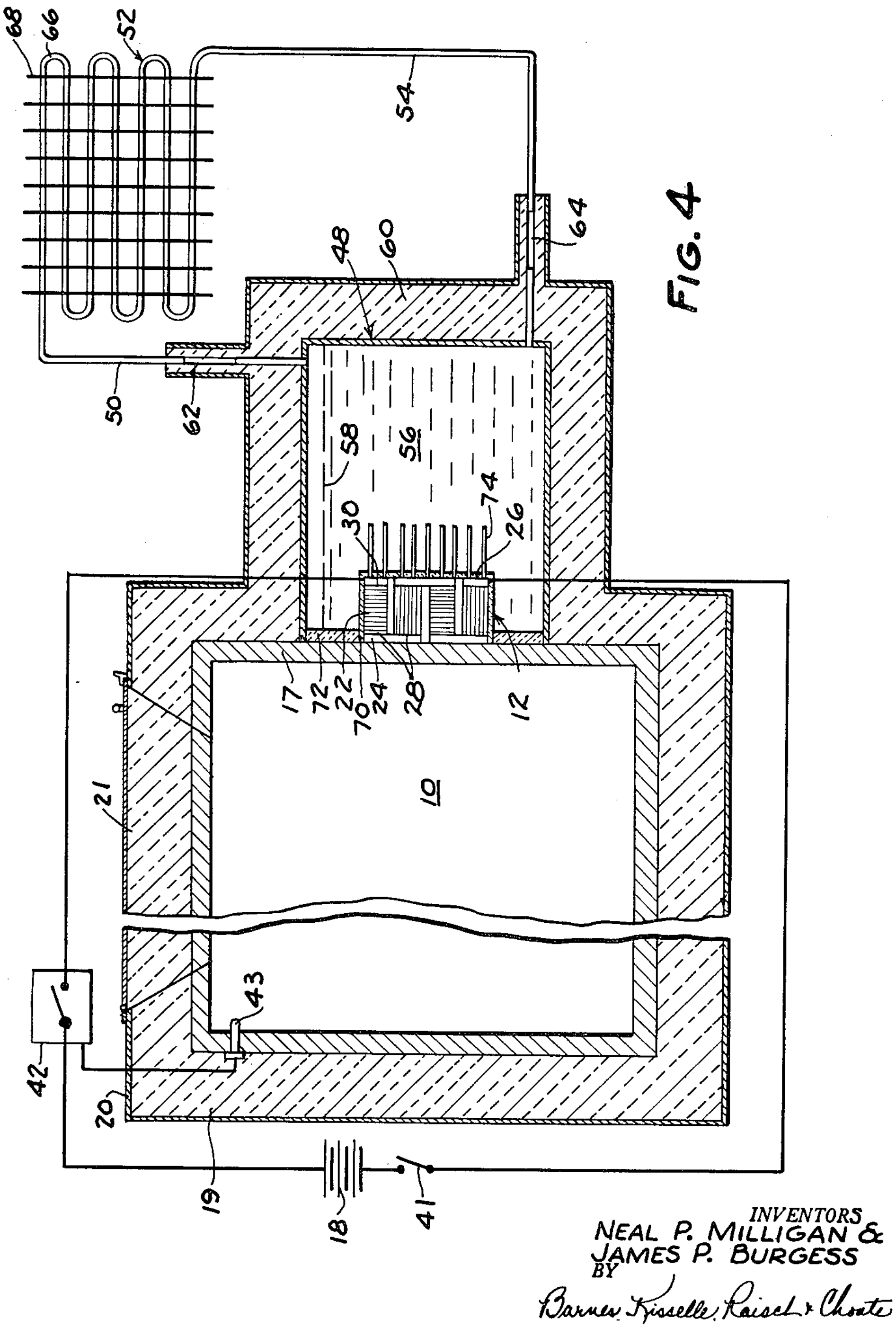
FIG. 4 is a schematic sectional view showing a thermoelectric cooling system having a liquid-to-gas device which transfers heat from the thermocouple to the ambient when the thermocouple is energized and isolates the thermocouple from the ambient when the thermocouple is not energized.

In FIG. 4 the secondary heat exchanger for minimizing reverse heat flow through the thermoelectric heat pump is a sealed liquid-to-gas system. Elements corresponding to those in FIG. 1 are indicated by corresponding reference numerals. The sealed liquid-to-gas system comprises an evaporator 48, an outlet tube 50, a condenser 52 and return tube 54, charged with a suitable liquid refrigerant 56 to a level in evaporator 48 indicated generally at 58. In the closed system liquid refrigerant 56 should have a boiling point slightly above the ambient temperature environment surrounding condenser 52. Evaporator 48 is encased with insulating material 60. Cold chamber 10 has insulation 19. Outlet tube 50 and return tube 54 have thermal insulating segments indicated generally at 62 and 64, respectively so that the entire pumping system, including cold chamber 10, evaporator 48 and a portion of outlet and return tubes 50, 54 adjacent evaporator 48, is thermally insulated from the ambient. Condenser 52 has conventional coils 66 and fins 68 and is positioned above evaporator 48 so that when refrigerant 56 condenses it returns to evaporator 48 through return tube 54 by gravity. Preferably thermocouples 22 are potted with a suitable corrosive resistant, and electrical and thermal insulating material 70. Cold chamber wall 17 is separated from refrigerant 56 by thermal insulation 72. Heat sink fins 74 are attached directly to conducting strips 26. However, since conventional liquid refrigerants, such as freon, are good electrical insulators and have low thermal conductivity, potting material 70 and insulation 72 could be omitted.

With the thermoelectric cooling apparatus described in conjunction with FIG. 4, when on-off switch 41 is closed, if the temperature within chamber 10 is above a prescribed cold temperature, switch 42 will be closed automatically to energize the thermoelectric heat pump 12. Heat pump 12 pumps heat from cold chamber 10 to liquid refrigerant 56. The temperature of refrigerant 56 increases until the boiling point of refrigerant 56 is reached, at which point heat will be transferred from evaporator 48 to the condenser 52 by the refrigerant in its vapor state. The refrigerant condenses in condenser 52, transferring heat to the ambient, the condensed liquid refrigerant being returned to evaporator 48 through return tube 54 by gravity. Heat is pumped from cold chamber 10 to the ambient through the liquid-to-gas system in this manner until the desired temperature within cold chamber 10 is reached at which time switch 42 opens automatically to turn heat pump 12 off. After heat pump 12 is deenergized, thermal conduction transfers heat from refrigerant 56 back to cold chamber 10 until the temperature equalizes in cold chamber 10, walls 17, thermoelectric heat pump 12, heat sink fins 59, refrigerant 56, evaporator 48 and those portions of outlet tube 50 and return tube 54 that are between the evaporator 48 and insulating segments 62, 64.

In the construction shown in FIG. 4, cold chamber 10 should have a relatively large thermal mass whereas the thermal mass of refrigerant 56, evaporator 48, heat sink fins 59 and thermoelectric heat pump 12 should be maintained at a minimum so that the temperature within the system is equalized without appreciably reducing the temperature within the cold chamber 10 when the heat pump is turned off. The closed system may be charged with any suitable refrigerant such as freon so long as the liquid refrigerant 56 in evaporator 48 boils and the vapor within condenser 52 condenses at a temperature slightly above the ambient in accordance with techniques well known in the refrigeration arts. In a closed evaporator-condenser system the freon vapor pressure will establish a boiling point near ambient temperature when properly charged.

We claim:

1. A cooling apparatus comprising a cooling chamber and means for transferring heat from said cooling chamber to an ambient environment, said heat transferring means comprising intermittently energized thermoelectric means and secondary heat transfer means, said secondary heat transfer means reducing reverse heat flow in a path through said thermoelectric means from said ambient environment to said cooling chamber when said thermoelectric means is not energized as compared to forward heat flow in the same path from said cooling chamber to the ambient environment when said thermoelectric means is energized, said secondary heat transfer means comprising a duct for carrying a fluid, a first portion of said duct communicating with said ambient environment and a second portion of said duct communicating with said thermoelectric means, and means intermittently energized concurrently with energization of said thermoelectric means to selectively force the fluid to flow in said duct when said thermoelectric means is energized.

2. A cooling apparatus comprising a cooling chamber and means for transferring heat from said cooling chamber to an ambient environment, said heat transferring means comprising intermittently energized thermoelectric means and secondary heat transfer means, said secondary heat transfer means limiting reverse heat flow through said thermoelectric means from said ambient environment to said cooling chamber when said thermoelectric means is not energized, said secondary heat transfer means comprising a gaseous medium, a duct for said medium, said duct having end portions communicating with said ambient environment and an intermediate portion communicating with said thermoelectric means, said intermediate portion being below said end portions, and a fan to force said gaseous medium through said duct when said thermoelectric means is energized.

3. A cooling apparatus comprising a cooling chamber and means for transferring heat from said cooling chamber to an ambient environment, said heat transferring means comprising intermittently energized thermoelectric means and secondary heat transfer means, said secondary heat transfer means limiting reverse heat flow through said thermoelectric means from said ambient environment to said cooling chamber when said thermoelectric means is not energized, said secondary heat transfer means comprising a fluid and a duct for carrying said fluid, a first portion of said duct communicating with said ambient environment and a second portion of said duct communicating with said thermoelectric means, a pump for forcing said fluid from said second portion to said first portion when said thermoelectric means is energized, and a valve positioned within said duct for selectively establishing fluid communication between said first and second portions.

4. A cooling apparatus comprising a cooling chamber and means for transferring heat from said cooling chamber to an ambient environment, said heat transferring means comprising intermittently energized thermoelectric means and secondary heat transfer means, said secondary heat transfer means reducing reverse heat flow in a path through said thermoelectric means from said ambient environment to said cooling chamber when said thermoelectric means is not energized as compared to forward heat flow in the same path from said cooling chamber to the ambient environment when said thermoelectric means is energized, said secondary heat transfer means comprising a duct for carrying a fluid, a first portion of said duct communicating with said ambient environment and a second portion of said duct communicating with said thermoelectric means, said first portion of said duct being thermally insulated from said ambient environment and said second portion of said duct being below said first portion.

5. A cooling apparatus comprising a cooling chamber and means for transferring heat from said cooling chamber to an ambient environment, said heat transferring means comprising intermittently energized thermoelectric means and secondary heat transfer means, said secondary heat transfer means reducing reverse heat flow in a path through said thermoelectric means from said ambient environment to said cooling chamber when said thermoelectric means is not energized as compared to forward heat flow in the same path from said cooling chamber to the ambient environment when said thermoelectric means is energized, said secondary heat transfer means comprising a duct for carrying a fluid, a first portion of said duct communicating with the ambient environment and a second portion of said duct communicating with said thermoelectric means, said second portion of said duct being below said first portion and thermally insulated from said first portion.

6. A cooling apparatus comprising a cooling chamber and means for transferring heat from said cooling chamber to an ambient environment, said heat transferring means comprising intermittently energized thermoelectric means and secondary heat transfer means, said secondary heat transfer means reducing reverse heat flow in a path through said thermoelectric means from said ambient environment to said cooling chamber when said thermoelectric means is not energized as compared to forward heat flow in the same path from said cooling chamber to the ambient environment when said thermoelectric means is energized, said secondary heat transfer means comprising a duct for carrying a fluid, a first portion of said duct communicating with the ambient environment and a second portion of said duct communicating with said thermoelectric means, said second portion of said duct being below said first portion, and a pump intermittently energized concurrently with energization of said thermoelectric means for forcing the fluid from said second portion of said duct to said first portion of said duct when said thermoelectric means is energized.

References Cited by the Examiner

UNITED STATES PATENTS

| | | | |
|---|---|---|---|
| 2,932,953 | 4/60 | Becket | 62—3 |
| 3,100,969 | 8/63 | Elfving | 62—3 |
| 3,138,934 | 6/64 | Roane | 62—3 |
| 3,154,926 | 11/64 | Hirschhorn | 62—3 |

WILLIAM J. WYE, *Primary Examiner.*